United States Patent
Lim et al.

(10) Patent No.: US 12,077,867 B2
(45) Date of Patent: Sep. 3, 2024

(54) SURFACE STRUCTURE HAVING FUNCTION FREEZING DELAY AND ICING LAYER SEPARATION AND MANUFACTURING METHOD THEREOF

(71) Applicant: Kookmin University Industry Academy Cooperation Foundation, Seoul (KR)

(72) Inventors: Sihyung Lim, Seoul (KR); Bok Hyun Lee, Seoul (KR); Sumit Barthwal, Seoul (KR)

(73) Assignee: Kookmin University Industry Academy Cooperation Foundation, Seoul (KR)

( * ) Notice: Subject to any disclaimer, the term of this patent is extended or adjusted under 35 U.S.C. 154(b) by 269 days.

(21) Appl. No.: 17/689,493

(22) Filed: Mar. 8, 2022

(65) Prior Publication Data

US 2022/0186382 A1     Jun. 16, 2022

Related U.S. Application Data

(62) Division of application No. 16/130,050, filed on Sep. 13, 2018, now abandoned.

(30) Foreign Application Priority Data

Sep. 13, 2017 (KR) .......................... 10-2017-0117144
Sep. 13, 2017 (KR) .......................... 10-2017-0117145

(51) Int. Cl.
*C23C 28/00* (2006.01)
*B32B 15/00* (2006.01)
(Continued)

(52) U.S. Cl.
CPC .............. *C23C 28/00* (2013.01); *B32B 15/00* (2013.01); *B32B 15/08* (2013.01); *B64D 15/08* (2013.01);
(Continued)

(58) Field of Classification Search
None
See application file for complete search history.

(56) References Cited

U.S. PATENT DOCUMENTS

2005/0027089 A1* 2/2005 Shimizu .............. H01L 21/3125
                                                252/364
2007/0134128 A1* 6/2007 Korlach ............. G01N 21/0303
                                                428/212
(Continued)

*Primary Examiner* — Allan W. Olsen
(74) *Attorney, Agent, or Firm* — Osha Bergman Watanabe & Burton LLP

(57) ABSTRACT

Provided is a surface structure having freezing-delaying performance and freezing layer-separating performance. The surface structure includes a microstructural layer formed in the form of microscale irregularities and a plurality of nanopores formed in the microstructural layer. A freezing-delaying layer is formed on a surface of the microstructural layer to delay a freezing phenomenon. Also, a hygroscopic material is accommodated in the nanopores, so that when a surface of the freezing-delaying layer starts to freeze, the hygroscopic material is discharged from the nanopores to form a hygroscopic material film, and thus adhesion between the freezing-delaying layer and ice is reduced to allow the ice to be detached from the freezing-delaying layer.

8 Claims, 12 Drawing Sheets

(51) Int. Cl.
  *B32B 15/08* (2006.01)
  *B64D 15/08* (2006.01)
  *C23C 14/04* (2006.01)
  *C23C 14/12* (2006.01)
  *C23C 14/24* (2006.01)
  *C23F 1/20* (2006.01)
  *C23F 1/26* (2006.01)
  *C25D 11/16* (2006.01)
  *C25D 11/18* (2006.01)
  *F28F 13/18* (2006.01)
  *C25D 11/04* (2006.01)

(52) U.S. Cl.
  CPC ............ *C23C 14/046* (2013.01); *C23C 14/12* (2013.01); *C23C 14/24* (2013.01); *C23F 1/20* (2013.01); *C23F 1/26* (2013.01); *C25D 11/16* (2013.01); *C25D 11/18* (2013.01); *F28F 13/185* (2013.01); *B32B 2305/026* (2013.01); *B32B 2307/728* (2013.01); *C25D 11/04* (2013.01); *F28F 2245/04* (2013.01)

(56) References Cited

U.S. PATENT DOCUMENTS

| | | | |
|---|---|---|---|
| 2009/0286133 A1* | 11/2009 | Trabold | H01M 8/04291 429/429 |
| 2011/0152557 A1* | 6/2011 | Hirayama | C08G 18/3206 556/419 |
| 2013/0295327 A1* | 11/2013 | Zhang | B82Y 30/00 428/141 |
| 2015/0275864 A1* | 10/2015 | Haupt | F03D 1/0675 416/1 |
| 2015/0368824 A1* | 12/2015 | Lim | C25D 11/08 205/190 |
| 2016/0074915 A1* | 3/2016 | White | B05D 1/60 427/551 |
| 2018/0127616 A1* | 5/2018 | Tuteja | C08G 18/1808 |
| 2020/0131375 A1* | 4/2020 | Chen | C08L 83/12 |

* cited by examiner

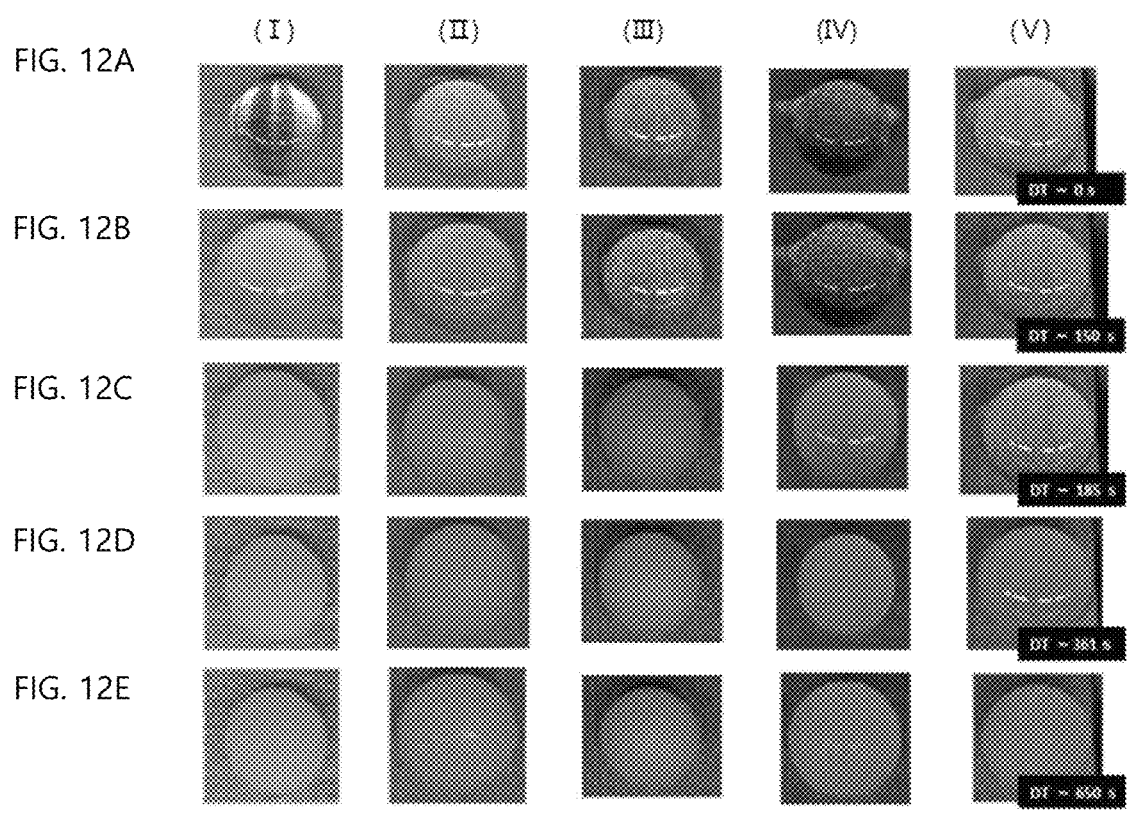

SURFACE STRUCTURE HAVING FUNCTION FREEZING DELAY AND ICING LAYER SEPARATION AND MANUFACTURING METHOD THEREOF

CLAIM FOR PRIORITY

This application claims priority to Korean Patent Applications No. 2017-0117144 filed on Sep. 13, 2017 and No. 201700117145 filed on Sep. 13, 2017 in the Korean Intellectual Property Office (KIPO), and is a divisional of U.S. application Ser. No. 16/030,150, the entire contents of which are hereby incorporated by reference.

BACKGROUND

1. Technical Field

Example embodiments of the present invention relate in general to a surface structure, and more specifically, to a surface structure having freezing-delaying performance and freezing layer-separating performance, and a method of preparing the same.

2. Related Art

In general, hydrophobicity refers to a property that the surface of an object is difficult to wet with water, and superhydrophobicity is defined as a case in which the contact angle of a water droplet which is brought into contact with a surface of a solid is greater than or equal to 150° in the related art. Therefore, superhydrophobicity refers to a physical property that the surface of an object is extremely difficult to wet with water.

Superhydrophobic surfaces with the water contact angle of greater than or equal to 150° are important in basic research and practical applications, and thus have attracted considerable interest in recent years. For example, plant leaves, insect wings, and bird wings have the characteristic that any external contaminants can be removed without a particular removing process or they are prevented from being contaminated in the first place. This is because plant leaves, insect wings, and bird wings have superhydrophobicity.

Wettability is a major surface property of a solid material and mainly depends on both a chemical composition and a geometrical micro/nanostructure. Wettable surfaces have attracted considerable interest in various fields such as oil-water separation, anti-reflection, anti-bioadhesion, anti-adhesion, anti-contamination, self-cleaning, fluid turbulence suppression, anti-freezing, etc. due to their potential applicability.

Meanwhile, superhydrophobic surfaces have recently been prepared using aluminum, and an aluminum surface is coated with a superhydrophobic material to impart superhydrophobicity to the aluminum surface. Aluminum has advantages such as excellent thermal and electrical conductivity, a light weight, a relatively lower price than copper, and excellent processability, and thus is widely used in many industrial fields.

However, when a surface is coated with a superhydrophobic material as described above, the coating layer thus produced generally has a large thickness (i.e., microscale thickness), and thus is easily detached by external friction, resulting in mechanical damage. Also, the coating layer is easily oxidized by substances that may be frequently contacted in ordinary environments, such as air and water, to lose its hydrophobicity. Moreover, although a surface for preventing a freezing phenomenon is realized by imparting superhydrophobicity to the aluminum surface, after a predetermined period of time elapses, the surface starts to freeze. In this case, a freezing layer formed on the surface is generally removed by using a chemical material or heating.

When a freezing layer is removed by using a chemical material, a surface of a hydrophobic layer may be damaged by the chemical material, and a surrounding environment may also be contaminated. When a freezing layer is removed by heating, it is not suitable for application to a machine in which energy efficiency is important such as electric vehicles (EVs).

PRIOR-ART DOCUMENTS

Patent Documents

Korean Registered Patent No. 10-1554983

SUMMARY

Accordingly, example embodiments of the present invention are provided to substantially obviate one or more problems due to limitations and disadvantages of the related art.

Example embodiments of the present invention provide a surface structure for delaying a freezing phenomenon, which includes a freezing-delaying layer formed by depositing polydimethylsiloxane on a micro/nano composite structure to a nanoscale thickness through physical vapor deposition, and thus maintains functionality of a surface and has high durability in a harsh environments of low temperature/high humidity, and a method of preparing the same.

Example embodiments of the present invention also provide a surface structure, which includes a hygroscopic material accommodated in nanopores of a micro/nano composite structure and a freezing-delaying layer formed on the micro/nano composite structure, and thus allows a freezing phenomenon on a surface of a metal substrate to be delayed, and has freezing layer-separating performance so that when a surface of the freezing-delaying layer is frozen, adhesion between the surface and ice is minimized by the hygroscopic material accommodated in the nanopores so that ice formed on the surface is easily detached, and a method of preparing the same.

In some example embodiments, there is provided a surface structure having freezing-delaying performance and freezing layer-separating performance, which includes a microstructural layer formed on a surface of a metal substrate in the form of microscale irregularities; and a plurality of nanopores formed in the microstructural layer, wherein the plurality of nanopores are formed in directions substantially perpendicular to upper and side surfaces of the microstructural layer.

The surface structure may further include a freezing-delaying layer formed on a surface of the microstructural layer.

The surface structure may further include a hygroscopic material accommodated in the plurality of nanopores.

The metal substrate may include aluminum (Al).

The freezing-delaying layer may be formed by depositing a material including polydimethylsiloxane to a thickness of 1 nm to 20 nm through physical vapor deposition.

The freezing-delaying layer may include fluorine (F).

The microstructural layer may include a flat surface and a side surface which are continuous and the same or different from each other, wherein the flat surface may have a horizontal length of 500 nm to 5 μm.

The plurality of nanopores may have a diameter of 10 nm to 50 nm.

The hygroscopic material may be discharged from the plurality of nanopores to form a hygroscopic material film when a surface of the freezing-delaying layer starts to freeze, and thus adhesion between the surface of the freezing-delaying layer and ice may be reduced to detach the ice from the freezing-delaying layer.

In other example embodiments, there is provided a method of preparing a surface structure having freezing-delaying performance and freezing layer-separating performance, which includes forming a microstructural layer on a surface of a metal substrate in the form of microscale irregularities by etching the metal substrate with an acid solution; forming a plurality of nanopores in the microstructural layer by anodizing the metal substrate; and forming a freezing-delaying layer on a surface of the microstructural layer, wherein the freezing-delaying layer is formed of a material including polydimethylsiloxane.

In the formation of a freezing-delaying layer, the freezing-delaying layer may be formed by vaporizing a cured fragment of polydimethylsiloxane through heating at 200° C. to 300° C. for 1 minute to 3 hours and depositing the vaporized polydimethylsiloxane on the metal substrate by physical vapor deposition.

The method may further include drying the metal substrate between the formation of a microstructural layer and the formation of nanopores.

The method may further include accommodating a hygroscopic material in the nanopores between the formation of nanopores and the formation of a freezing-delaying layer.

The hygroscopic material may be discharged from the nanopores to form a hygroscopic material film when a surface of the freezing-delaying layer starts to freeze, and thus adhesion between the surface of the freezing-delaying layer and ice may be reduced to allow the ice to be detached from the freezing-delaying layer.

In still other example embodiments, there is provided an aircraft part including the above-described improved surface structure.

In yet other example embodiments, there is provided a heat exchanger including the above-described improved surface structure.

BRIEF DESCRIPTION OF DRAWINGS

Example embodiments of the present invention will become more apparent by describing in detail example embodiments of the present invention with reference to the accompanying drawings, in which:

FIGS. 12A-12E are is a set of images for measuring a time taken for freezing a droplet on the surface of a metal substrate according to a type of a freezing-delaying layer using the experimental device for measuring humidity shown in FIG. 10.

DESCRIPTION OF EXAMPLE EMBODIMENTS

Figure 1:
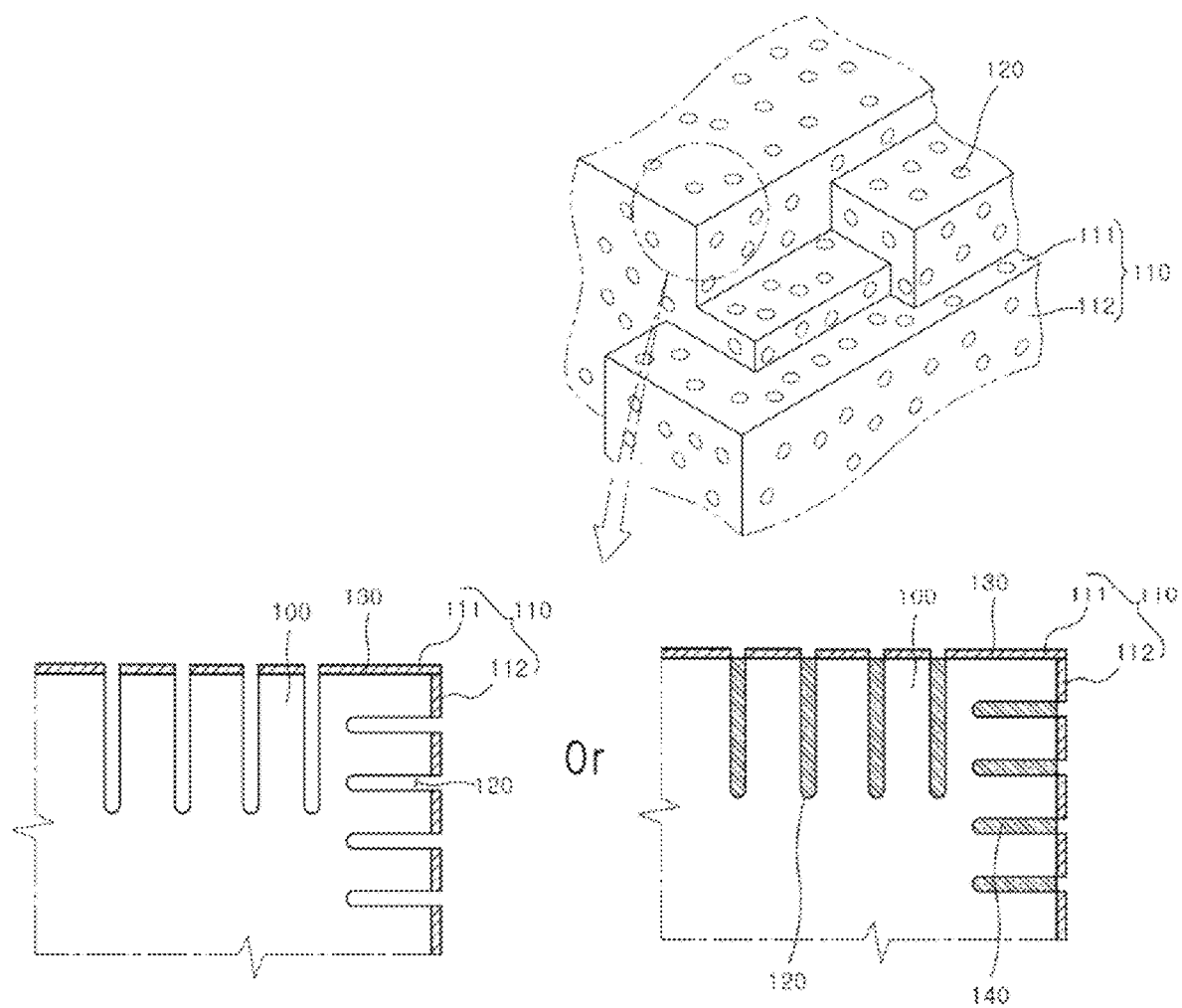
FIG. 1 is a schematic diagram of a surface structure according to the present invention.

Example embodiments of the present invention are disclosed herein. However, specific structural and functional details disclosed herein are merely representative for the purpose of describing example embodiments of the present invention, however, example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Hereinafter, the present invention will be described in detail with reference to the accompanying drawings. In the description of the present invention, when it is determined that detailed descriptions of related well-known functions or configurations unnecessarily obscure the gist of the present invention, the detailed descriptions thereof will be omitted.

Figure 2:
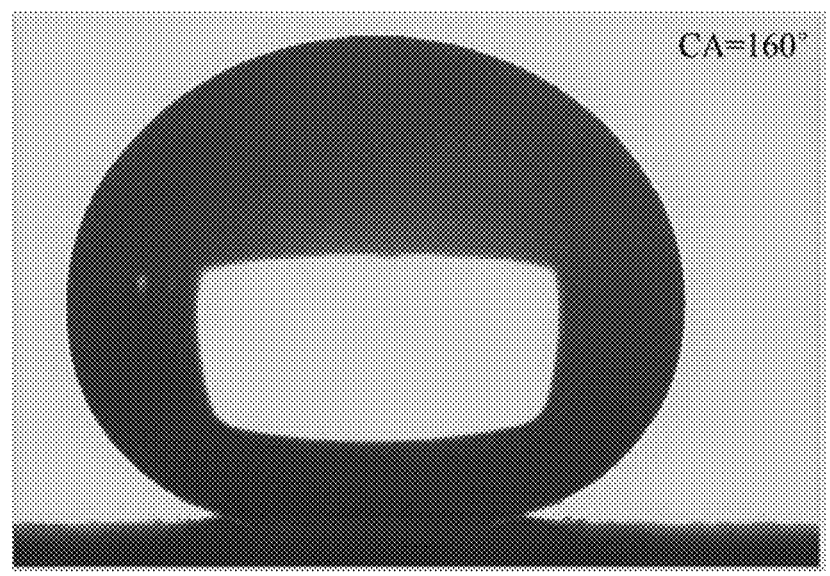
FIG. 2 is an image obtained by photographing the water contact angle of a surface structure according to the present invention.

FIG. 1 is a diagram of a surface structure according to exemplary embodiment of the present invention. FIG. 2 is an image obtained by photographing the water contact angle of the surface structure shown in FIG. 1.

Referring to FIGS. 1 and 2, a surface structure according to exemplary embodiment of the present invention may be formed on a surface of a metal substrate 100 and may include a microstructural layer 110, nanopores 120, and a freezing-delaying layer 130. The surface structure according to exemplary embodiment of the present invention may further include a hygroscopic material 140 accommodated in the nanopores 120. Referring to FIG. 1, the surface structure according to the present invention may be a structure including the hygroscopic material accommodated in the nanopores (the bottom right) or a structure not including the hygroscopic material (the bottom left).

The metal substrate 100 may include aluminum (Al). Aluminum (Al) is cheaper than copper and has excellent processability as well as excellent thermal and electrical conductivity, and thus may be applied in various fields.

However, the metal substrate 100 is not limited to aluminum, and titanium (Ti) may also be used.

The microstructural layer 110 may be formed on a surface of the metal substrate 100 in the form of microscale irregularities. The microstructural layer 110 includes a flat surface 111 and a side surface 112, which are continuous and the same or different from each other, and the flat surface 111 may have a horizontal length of 500 nm to 5 μm.

In this case, since the side surface 112 acts as a plane that connects flat surfaces 111 of various heights, the flat surface 111 and the side surface 112 make a predetermined angle. That is, the microstructural layer 110 consists of a multi-layered irregular structure including flat surfaces 111 of various sizes.

The nanopores 120 may be formed in a surface of the microstructural layer 110 and have a diameter of 10 nm to 50 nm. In this case, when the diameter of the nanopores 120 is outside the above range, the surface structure with freezing layer-separating performance according to the present invention may not realize superhydrophobicity.

When the diameter of the nanopore 120 is excessively increased, the nanopore 120 may be combined with adjacent nanopores, which interferes with the realization of superhydrophobicity.

In addition, when the diameter of the nanopores 120 is excessively decreased, the nanopores do not act as a factor for enhancing superhydrophobicity, and thus there is no significant difference from a case in which only the microstructural layer 110 is formed.

In this case, the nanopores 120 may be formed by being extended in directions substantially perpendicular to the flat surface 111 and the side surface 112. Here, the extending directions of the nanopores 120 are substantially perpendicular to the flat surface 111 and the side surface 112, which means that the nanopores 120 are extended in a direction distinct from a horizontal direction of the flat surface 111 and the side surface 112, rather than having an angle of 90° with respect to the flat surface 111 and the side surface 112.

The freezing-delaying layer 130 is formed on the surface of the microstructural layer 110 to delay a freezing phenomenon on the surface when the metal substrate 100 is in a low temperature/high humidity environment.

The freezing-delaying layer 130 has a thickness of 1 nm to 20 nm. Accordingly, the entrance of the nanopore 120 is not blocked by the freezing-delaying layer 130 but open, and the freezing-delaying layer 130 may not be substantially formed inside the nanopores 120.

As described above, the surface structure according to exemplary embodiment of the present invention has a water contact angle of about 160° as shown in FIG. 2, and thus the metal substrate 100 may delay a freezing phenomenon due to superhydrophobicity.

The freezing-delaying layer 130 may be formed of a material including fluorine (F) and may also be formed of a material including polydimethylsiloxane (PDMS).

When the freezing-delaying layer 130 is formed of a material including fluorine, the metal substrate 100 may be immersed in a liquid chemical including fluorine to form the freezing-delaying layer 130.

The liquid chemical including fluorine may be a fluorine-containing silane compound, a fluorine-containing thiol compound, or a fluorine-containing polymer.

When the freezing-delaying layer 130 is formed of a material including polydimethylsiloxane, a freezing phenomenon on a surface of the metal substrate 100 may be delayed due to the hydrophobicity of polydimethylsiloxane.

In this case, the freezing-delaying layer 130 may be formed on the surface of the microstructural layer 110 by introducing the metal substrate 100 and a cured fragment of polydimethylsiloxane into an oven and heating at 200° C. to 300° C. for 1 minute to 3 hours to vaporize the fragment of polydimethylsiloxane, and then depositing the vaporized polydimethylsiloxane on the metal substrate 100 by physical vapor deposition.

The surface structure according to exemplary embodiment of the present invention may exhibit an effect of delaying a freezing phenomenon even when only the freezing-delaying layer 130 is included without a hygroscopic material 140 to be described below.

Figure 3:
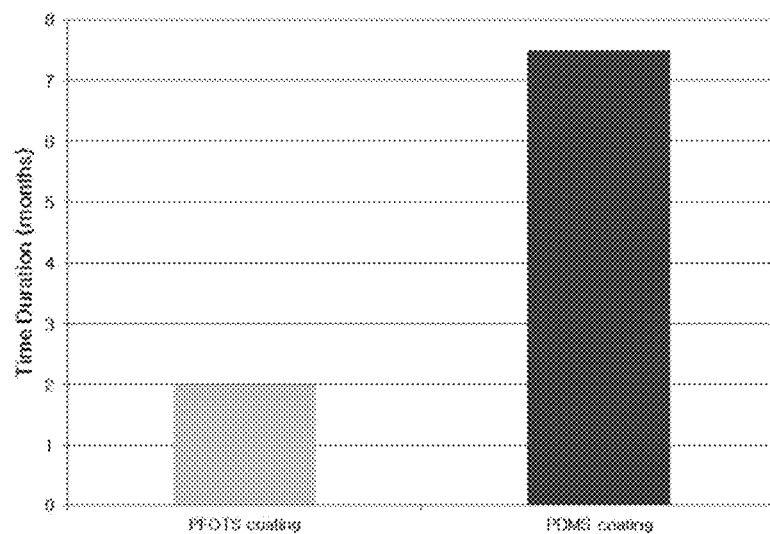
FIG. 3 is a graph for comparing the duration of superhydrophobicity of a surface structure according to the present invention with that of a surface structure in which a fluorine-coating layer is formed.

For example, as shown in FIG. 3, the duration of superhydrophobicity of the surface structure including the freezing-delaying layer 130 formed of polydimethylsiloxane according to the present invention is further maintained for greater than 5 months compared to a fluorine (PFOTS)-coated surface.

That is, the duration of superhydrophobicity, which affects the delay of a freezing phenomenon in the surface structure according to the present invention, is maintained longer than that of a conventional superhydrophobic surface, and thus an effect of delaying a freezing phenomenon may be maintained for a longer period of time.

As described above, the surface structure according to exemplary embodiment of the present invention may include a hygroscopic material 140 accommodated in the nanopores 120.

The hygroscopic material 140 is accommodated in the nanopores 120 and thus reduces adhesion between the microstructural layer 110 and the freezing layer when ice/frost is formed on the surface of the micro structural layer 110. The hygroscopic material 140 according to the present invention may include polyurethane or polyacrylic acid.

Specifically, the hygroscopic material 140 is expanded due to moisture around the metal substrate 100 in a low temperature/high humidity environment and thus discharged from the nanopores 120. In this process, a hygroscopic material film (not shown) is formed.

In this case, when a low temperature/high humidity environment is maintained, ice/frost is formed on the surface of the metal substrate 100, wherein the ice/frost is substantially formed on a surface of the hygroscopic material film. Therefore, the hygroscopic material 140 reduces adhesion between the surface of the freezing-delaying layer 130 and the ice to allow the ice to be detached from the freezing-delaying layer 130.

That is, adhesion between the freezing-delaying layer 130 and the ice is reduced due to the hygroscopic material film formed of the hygroscopic material 140, which allows the ice to be easily detached from the metal substrate 100 by applying slight vibrations or slight wind to the metal substrate 100.

The surface structure with freezing layer-separating performance according to the present invention may be applied to an aircraft part or a heat exchanger.

For example, when the surface structure with freezing layer-separating performance according to the present invention is applied to a sensor with which an aircraft is equipped, even if a freezing layer is formed in the sensor in a low temperature/high humidity environment during flying, the freezing layer may be easily detached by slight vibrations of the aircraft itself or wind caused by flying.

Therefore, the aircraft sensor performs accurate sensing so that more stable flight may be achieved.

In addition, when the surface structure with freezing layer-separating performance according to the present invention is applied to a heat exchanger, specifically, a heat exchanger included in an electric vehicle, although a freezing layer is formed in the heat exchanger during driving, the freezing layer may be easily detached by slight vibrations of the vehicle or wind caused by driving.

Accordingly, a process for removing the freezing layer of a heat exchanger by converting electrical energy required for driving an electric vehicle to heat energy may be omitted, and thus electrical energy may be more efficiently used.

Hereinafter, a method of preparing a surface structure according to the present invention will be described with reference to FIG. 1 to FIG. 6. As described above, the surface structure according to the present invention may be a structure including or not including the hygroscopic material 140. A method of preparing a structure not including the hygroscopic material 140 is referred to as first embodiment, and a method of preparing a structure including the hygroscopic material 140 is referred to as second embodiment. The difference between the first embodiment and the second embodiment is whether or not there is a process of accommodating a hygroscopic material in nanopores prior to the formation of a freezing-delaying layer.

Figure 4:
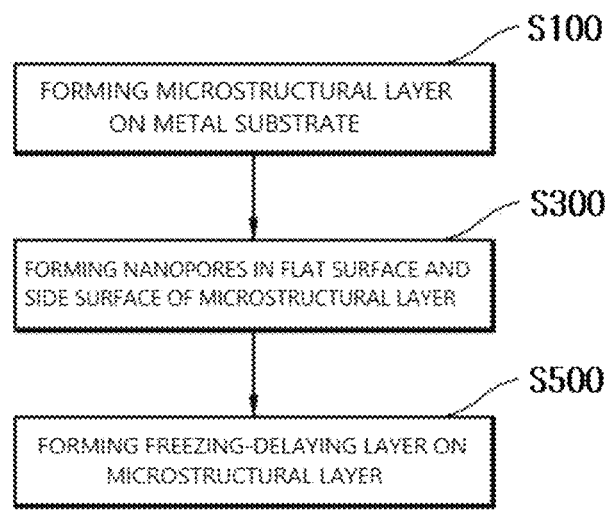
FIG. 4 is a flowchart of a method of preparing a surface structure according to a first embodiment of the present invention.
Figure 5:
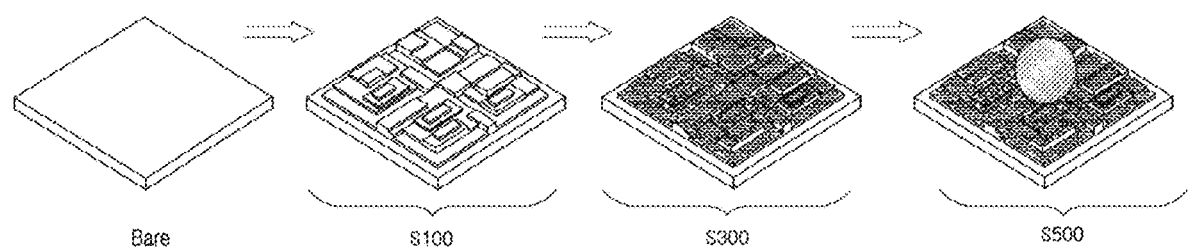
FIG. 5 is a schematic diagram of the structure of a metal substrate surface for each step of the preparation method according to the first embodiment shown in FIG. 4.

A flowchart of the method of preparing a surface structure according to the first embodiment and a schematic diagram of a surface structure in the preparation process are illustrated in FIG. 4 and FIG. 5, respectively. Referring to FIG. 4 and FIG. 5, the method of preparing a surface structure according to the first embodiment of the present invention may include forming a microstructural layer (S100), drying a metal substrate, forming nanopores (S300), and forming a freezing-delaying layer (S500).

Figure 8A:
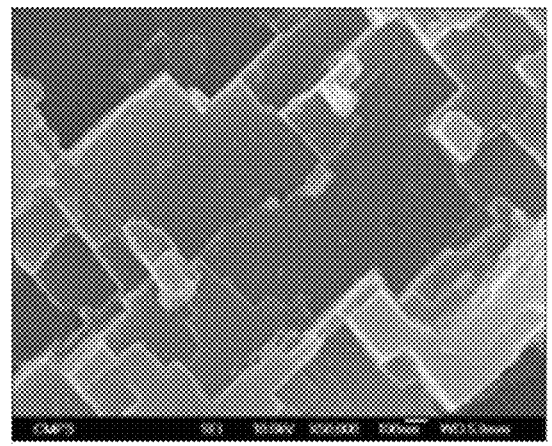
FIGS. 8A and 8B are a set of images of the microstructural layer and nanopores which are included in a surface structure according to the present invention.

In the formation of a microstructural layer (S100), the metal substrate 100 is etched using an acid solution to form the microstructural layer 110 on a surface of the metal substrate 100 in the form of microscale irregularities as shown in of FIG. 8A.

In this case, the etching of the metal substrate 100 may be performed in an acid solution for about 10 seconds to about 10 minutes, and in the method of preparing a surface structure according to the present invention, is preferably performed for 1 minute to 5 minutes. Also, the formation of a microstructural layer (S100) may be performed at room temperature.

The acid solution may include any inorganic acid such as hydrochloric acid, nitric acid, sulfuric acid, phosphoric acid, any organic acid such as organic acetic acid, organic sulfonic acid, a perfluorinated carboxylic acid, or a mixture of two or more thereof.

The acid solution may be used as is, and in some cases, the acid solution diluted with a solvent such as water, etc. may be used. When the acid solution diluted with a solvent is used, each acid compound may be appropriately diluted according to its property. For example, hydrochloric acid may be diluted with deionized water at a ratio of about 1:1 to about 1:5, and in the method of preparing a surface structure with freezing layer-separating performance according to the present invention, preferably at a ratio of about 1:2.

In the formation of a microstructural layer (S100) according to the present invention, since the metal substrate 100 is immersed in an acid solution to form the microstructural layer 110 on a surface of the metal substrate 100, a chamber which has to be designed separately according to a structure is not necessary, and this process may also be performed on a three-dimensional large-sized metal substrate 100.

In the drying of a metal substrate, the metal substrate 100 whose surface has been etched in the formation of a microstructural layer (S100) is washed with deionized water and then dried, and the drying may be performed through heat or a high-speed nitrogen jet. The drying of a metal substrate may be optionally performed.

Figure 8B:
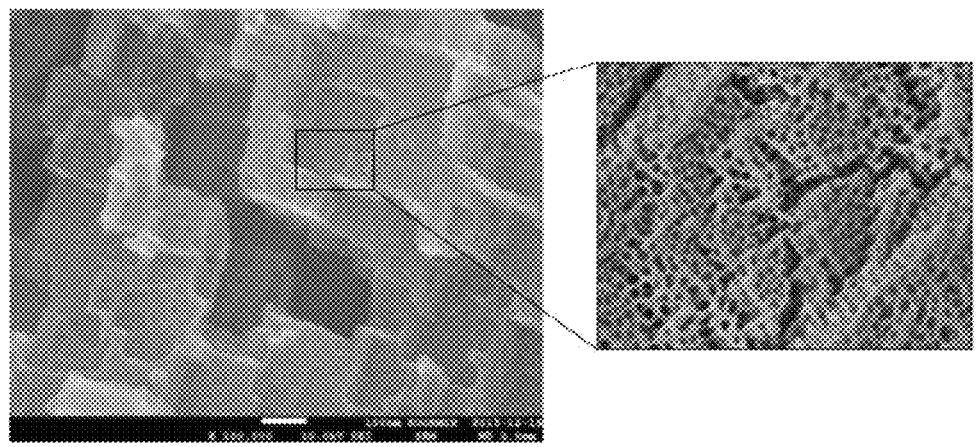

In the formation of nanopores (S300), the metal substrate 100 is anodized to form nanopores 120 having a diameter of 10 nm to 50 nm in the microstructural layer 110 as shown in (b) of FIG. 8B.

A method of anodizing the metal substrate 100 is well known to those skilled in the art. For example, the metal substrate 100 is immersed in a sulfuric acid solution, an oxalic acid solution, a citric acid solution, a sodium nitrate solution, a sodium chloride solution, a chromic acid solution, or a phosphoric acid solution, and voltage is applied using the metal substrate 100 as a positive electrode.

In this case, a voltage of about 10 V to about 30 V may be applied. The anodization may be performed at room temperature for about 1 minute to about 30 minutes, and in the method of a surface structure with freezing layer-separating performance according to the present invention, preferably for about 3 minutes to about 25 minutes.

In the formation of nanopores (S300) like the above-described formation of a microstructural layer (S100), since the metal substrate 100 is immersed in a solution for anodization to form nanopores 120 in the microstructural layer 110, a chamber which has to be designed separately according to a structure is not necessary, and this process may also be performed on a three-dimensional large-sized metal substrate 100.

As described above, in the preparation method according to the first embodiment, the formation of a freezing-delaying layer (S500) is performed on the surface of the microstructural layer 110 without a process of forming the hygroscopic material 140.

In the formation of a freezing-delaying layer (S500), polydimethylsiloxane is deposited on the surface of the microstructural layer 110 by physical vapor deposition to form the freezing-delaying layer 130 having a thickness of 1 nm to 20 nm.

In the formation of a freezing-delaying layer (S500), the freezing-delaying layer 130 may be formed by introducing the metal substrate 100 and a cured fragment of polydimethylsiloxane into an oven and heating at 200° C. to 300° C. for 1 minute to 3 hours to vaporize the fragment of polydimethylsiloxane, and then depositing the vaporized polydimethylsiloxane on the metal substrate 100 by physical vapor deposition.

Figure 9A:
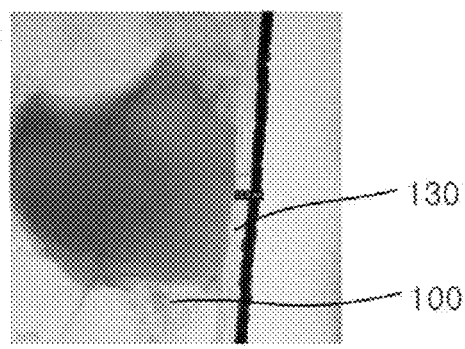
FIGS. 9A and 9B are a set of images illustrating the thickness of a freezing-delaying layer according to time required for the formation of a freezing-delaying layer when a freezing-delaying layer included in a surface structure according to the present invention includes polydimethylsiloxane.
Figure 9B:
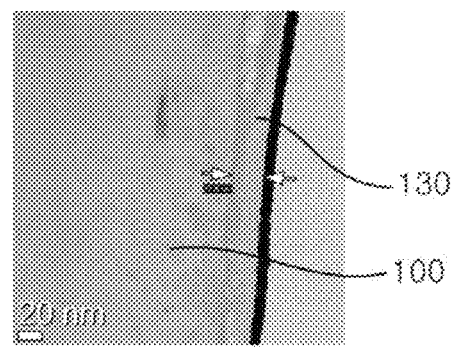

As shown in FIGS. 9A and 9B, when the formation of a freezing-delaying layer (S500) according to the present invention is continued at 230° C. for 5 minutes, a freezing-delaying layer 130 having a thickness of 13.9 nm is formed, and when the formation of a freezing-delaying layer (S500) is continued at 230° C. for 10 minutes, a freezing-delaying layer 130 having a thickness of 27.6 nm is formed.

In this case, the fragment of polydimethylsiloxane is fabricated by mixing a polydimethylsiloxane precursor and a polydimethylsiloxane curing agent at a ratio of 10:1, introducing the resulting mixture into an oven, and heating at 120° C. for 2 hours.

As a result, in the formation of a freezing-delaying layer (S500), the freezing-delaying layer 130 has a relatively very small thickness compared to a conventional coating layer, that is, a hydrophobic layer formed by depositing polydimethylsiloxane through spin coating or dip coating, and thus is not easily detached by external friction, resulting in enhanced durability. Also, the freezing-delaying layer 130 is applied to the surface of the metal substrate 100 which is continuously brought into externally frictional contact such as the surface of an aircraft or a watercraft, and thus allows a freezing phenomenon to be delayed for a long period of time.

Examples of the humidity experiment using the structure for delaying a freezing phenomenon which is prepared by the above-described preparation method according to the first embodiment will be described as follows.

Before examples of the humidity experiment are described, an experimental device for measuring humidity used in the humidity experiment will be described as follows.

Figure 10:
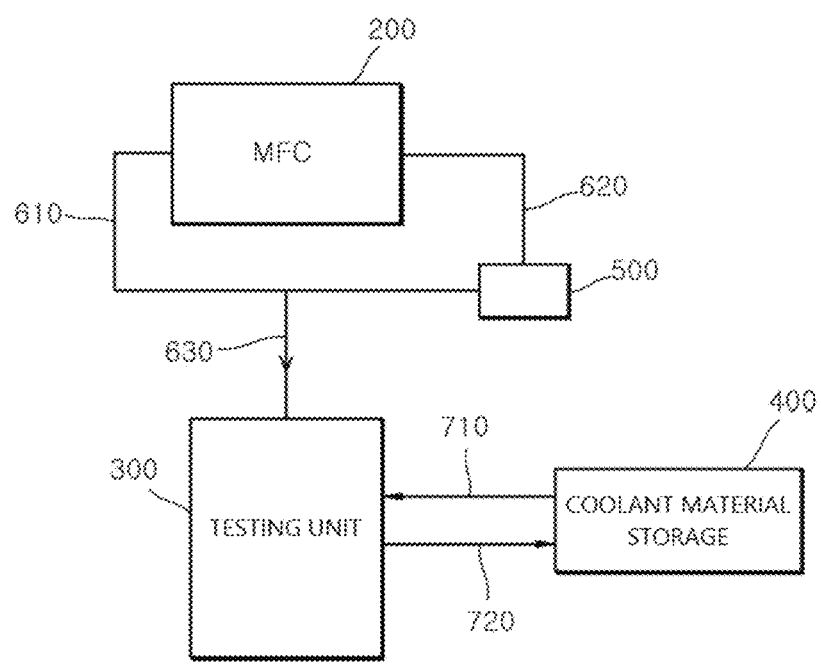
FIG. 10 is a schematic diagram of an experimental device for measuring the humidity of a surface structure according to the present invention.

As shown in FIG. 10, the experimental device for measuring humidity includes a mass flow controller (MFC) 200, a humidity-generating unit 500, a cooling material storage 400, a testing unit 300, and a supply pipe (reference number is not shown). The mass flow controller 200 transfers air to the testing unit 300 through a first supply pipe 610, a second supply pipe 620, and a third supply pipe 630, all of which are included in the supply pipe. When transferring air to the testing unit 300, the second supply pipe 620 passes through the humidity-generating unit 500, and accordingly, humidity transferred from the second supply pipe 620 becomes 100%. The mass flow controller 200 independently controls the flow rate of air moving in the first supply pipe 610 and the second supply pipe 620 to control the humidity of air to be supplied to the testing unit 300. For example, when air with a relative humidity of 80% is supplied to the testing unit 300, the amount of air supplied from the first supply pipe 610 and the second supply pipe 620 is controlled at a ratio of 1:4, and air moving from the first supply pipe 610 and the second supply pipe 620 is mixed in the third supply pipe 630, and thus air with a predetermined humidity is allowed to be transferred to the testing unit 300. The cooling material storage 400 includes a cooling material stored therein, and the cooling material is transferred from the cooling material storage 400 to the testing unit 300 through a cooling material supply unit 710, and discharged from the testing unit 300 through a cooling material discharge unit 720. The testing unit 300 accommodates the metal substrate 100 therein and includes a chamber, a temperature sensor, a humidity sensor, and a cooling plate. The chamber accommodates the metal substrate 100 so that the humidity experiment of the metal substrate 100 can be performed, and at least a portion of one surface of the chamber is made of a transparent material such as glass so that the frost/ice forming process on the metal substrate 100 can be observed from outside the chamber in real time. The cooling plate is an element configured to cool the metal substrate 100 accommodated in the chamber, and in this embodiment, a Peltier element is used to control the temperature of the metal substrate 100. The temperature sensor is configured to measure the temperature inside the chamber, and the humidity sensor is configured to measure the humidity inside the chamber, and thus the temperature/humidity inside the chamber are checked to perform a more accurate experiment.

Experimental Example 1

Figure 11A:
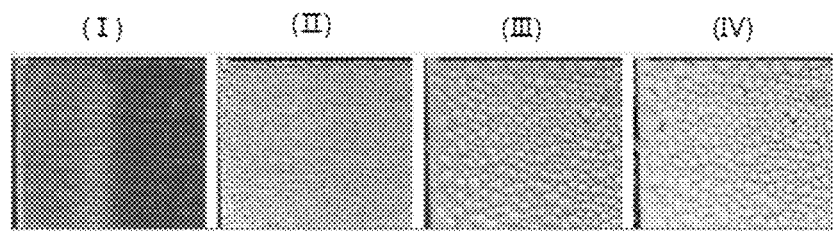
FIGS. 11A-11E are is a set of images for measuring a time taken for formation of ice/frost on the surface of a metal substrate at a relative humidity of 80% according to a type of a freezing-delaying layer using the experimental device for measuring humidity shown in FIG. 10.
Figure 11B:
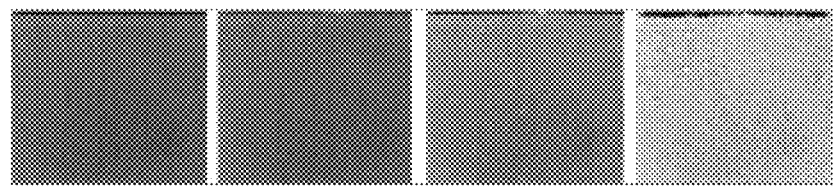
Figure 11C:
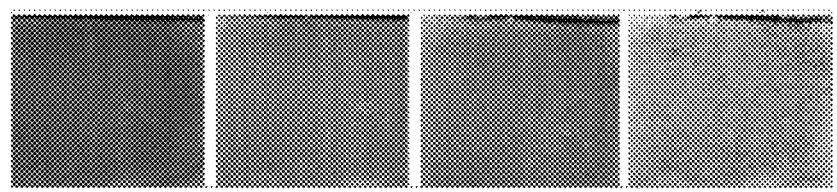
Figure 11D:
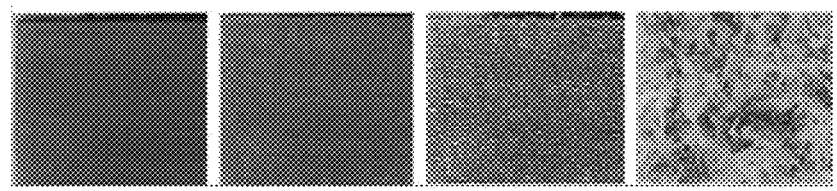
Figure 11E:
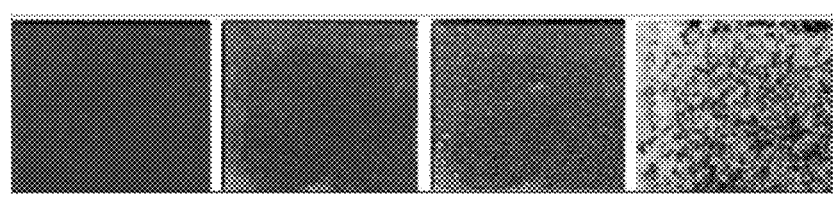

Measurement of Time Taken for Formation of Ice/Frost on Surface of Metal Substrate at Relative Humidity of 80% According to Type of Freezing-Delaying Layer Referring to FIGS. 11A-11E, FIG. 11A shows an aluminum surface which was not subjected to any processes, FIG. 11B shows an aluminum surface formed by performing the processes of forming a microstructural layer (S100), forming nanopores (S300), and forming a freezing-delaying layer (S500), wherein the freezing-delaying layer was formed by immersing an aluminum substrate in silicone oil, FIG. 11C shows an aluminum surface formed by performing the processes of forming a microstructural layer (S100) and forming nanopores (S300), and forming a freezing-delaying layer by immersing an aluminum substrate in silicone oil, FIG. 11D shows an aluminum surface formed by performing the processes of forming a microstructural layer (S100) and forming nanopores (S300), and forming a freezing-delaying layer by immersing an aluminum substrate in 1H,1H,2H, 2H-perfluorooctyltrichlorosilane (PFOTS), and FIG. 11E shows an aluminum surface formed by performing the processes of forming a microstructural layer (S100), forming nanopores (S300), and forming a freezing-delaying layer (S500) and which is the same as the surface structure prepared by the preparation method according to the first embodiment of the present invention. The temperature of the aluminum surfaces of FIGS. 11A-11E was −5° C., the relative humidity thereof was 80%, and the width/length size thereof was 2 cm.

In this case, the images in columns (I), (II), and (III) of FIGS. 11A-11E show images obtained by photographing at 0, 5, and 15 minutes after the humidity experiment, respectively, and the images in column (IV) of FIGS. 11A-11E show images obtained by photographing when frost/ice is formed on the entire aluminum surface.

As shown in FIGS. 11A-11E, it took 25 minutes to entirely freeze the aluminum surface in (a) of FIG. 11, 18 minutes to entirely freeze the aluminum surface in FIG. 11B, 23 minutes to entirely freeze the aluminum surface in FIG. 11C, 44 minutes to entirely freeze the aluminum surface in FIG. 11D, and 70 minutes to entirely freeze the aluminum surface in FIG. 11E. Accordingly, the metal substrate 100 prepared by the method of preparing a surface structure for delaying a freezing phenomenon according to the present invention exhibited the highest freezing-delaying rate, and thus it is possible to maintain functionality of the surface in a harsh environment of low temperature/high humidity.

In addition, the period of a removing process of a freezing layer formed on the surface is prolonged by delaying a freezing phenomenon on the surface, so that damage to the surface caused by the removing process of a freezing layer is reduced, and thus it is possible to maintain superhydrophobicity for a longer period of time.

Experimental Example 2

Measurement of Time Taken for Freezing Droplet on Surface of Metal Substrate According to Type of Freezing-Delaying Layer Referring to FIGS. 12A-12E, the images in column (I) of FIGS. 12A-12E shows an aluminum surface which was not subjected to any processes, the images in column (II) of FIGS. 12A-12E shows an aluminum surface formed by performing the processes of forming a microstructural layer (S100), forming nanopores (S300), and forming a freezing-delaying layer (S500), wherein the freezing-delaying layer was formed by immersing an aluminum substrate in silicone oil, the images in column (III) of FIGS. 12A-12E shows an aluminum surface formed by performing the processes of forming a microstructural layer (S100) and forming nanopores (S300), and forming a freezing-delaying layer by immersing an aluminum substrate in silicone oil, the images in column (IV) of FIGS. 12A-12E shows an aluminum surface formed by performing the processes of forming a microstructural layer (S100) and forming nanopores (S300), and forming a freezing-delaying layer by immersing an aluminum substrate in PFOTS, and the images in column (V) of FIGS. 12A-12E shows an aluminum surface formed by performing the processes of forming a microstructural layer (S100), forming nanopores (S300), and forming a freezing-delaying layer (S500) and which is the same as the metal substrate 100 prepared by the method of preparing a surface structure for delaying a freezing phenomenon according to the present invention. The temperature of the aluminum surfaces of (I) to (V) of FIGS. 12A-12E was −10° C., and the relative humidity thereof was 50%.

In this case, FIGS. 12A-12E show images obtained by photographing at 0, 150, 185, 361, and 650 seconds after the humidity experiment, respectively.

As shown in FIGS. 12A-12E, the droplets falling on the aluminum surfaces of (I) to (III) of FIGS. 12A-12E were completely frozen within a period of 150 seconds to less than 185 seconds, the droplets falling on the aluminum surfaces of (IV) of FIGS. 12A-12E were completely frozen within a period of 185 seconds to less than 361 seconds, and the droplets falling on the aluminum surfaces of (V) of FIGS. 12A-12E were completely frozen within a period of 361 seconds to less than 650 seconds.

Accordingly, the droplets falling on the metal substrate 100 prepared by the method of preparing a surface structure for delaying a freezing phenomenon according to the present invention exhibited the highest freezing-delaying rate, and thus it is possible to maintain functionality of the surface in a harsh environment of low temperature/high humidity.

In addition, since the period of a removing process of a freezing layer formed on the surface is prolonged by delaying a freezing phenomenon on the surface, the damage to the surface caused by the removing process of a freezing layer is reduced, and thus it is possible to maintain superhydrophobicity for a longer period of time.

Experimental Example 3

Figure 13A:
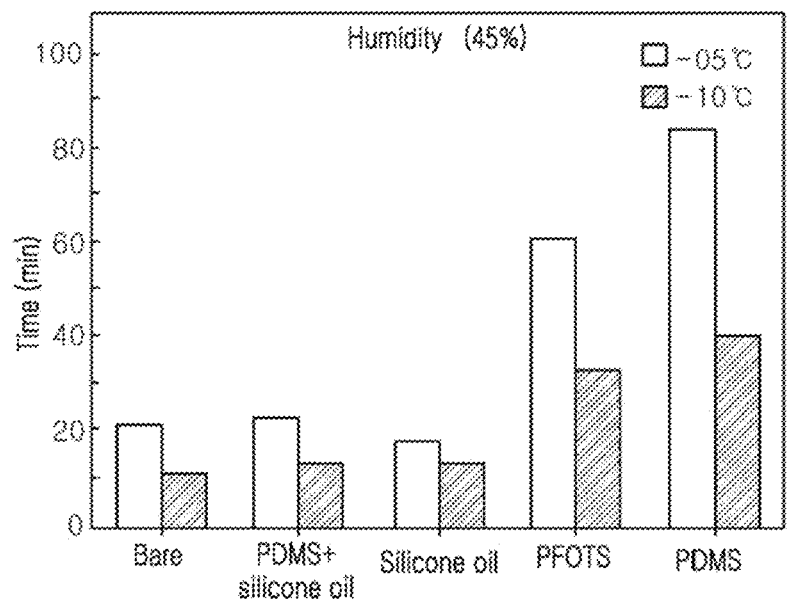
FIGS. 13A and 13B illustrate the results of measurement of a time taken for formation of ice/frost on the surface of a metal substrate according to a type of a freezing-delaying layer and a change in relative humidity using the experimental device for measuring humidity shown in FIG. 10.

Measurement of Time Taken for Formation of Ice/Frost on Surface of Metal Substrate 100 According to Type of Freezing-Delaying Layer 130 and Change in Relative Humidity FIG. 13A is a graph comparing a time taken for forming frost/ice on the entire aluminum surface at a relative humidity of 45% according to a type of the freezing-delaying layer 130 formed on the aluminum surface.

The type of the freezing-delaying layer 130 formed on the aluminum surface is the same as in Experimental Example 2, and the type of the freezing-delaying layer 130 formed on the aluminum surface in Experimental Example 3 is classified into (I) to (V) as described in Experimental Example 2.

When a relative humidity was 45% and a temperature of the specimen was −5° C., it took about 20 minutes to entirely freeze the aluminum surface in the case of (I) to (III), it took about 60 minutes to entirely freeze the aluminum surface in the case of (IV), and it took about 80 minutes to entirely freeze the aluminum surface in the case of (V).

Also, when a relative humidity was 45% and a temperature of the specimen was −10° C., it took about 10 minutes to entirely freeze the aluminum surface in the case of (I), it took about 20 minutes to entirely freeze the aluminum surface in the case of (II) and (III), it took about 37 minutes to entirely freeze the aluminum surface in the case of (IV), and it took about 40 minutes to entirely freeze the aluminum surface in the case of (V).

As described above, it can be confirmed that the aluminum surface (V) prepared by the method of preparing a surface structure for delaying a freezing phenomenon according to the present invention exhibited the highest freezing-delaying rate at a relative humidity of 45% and a specimen temperature of both −5° C. and −10° C.

Figure 13B:
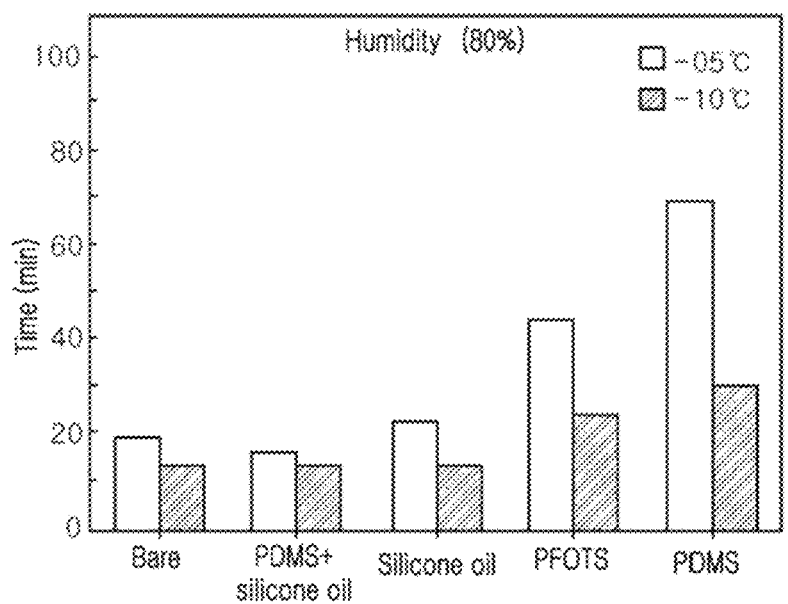

FIG. 13B is a graph comparing a time taken for forming frost/ice on the entire aluminum surface at a relative humidity of 80% according to a type of the freezing-delaying layer 130 formed on the aluminum surface.

The type of the freezing-delaying layer 130 formed on the aluminum surface is the same as in Experimental Example 2, and the type of the freezing-delaying layer 130 formed on the aluminum surface in Experimental Example 3 is classified into (I) to (V) as described in Experimental Example 2.

When a relative humidity was 80% and a temperature of the specimen was −5° C., it took about 20 minutes to entirely freeze the aluminum surface in the case of (I) to (III), it took about 40 minutes to entirely freeze the aluminum surface in the case of (IV), and it took about 60 minutes to entirely freeze the aluminum surface in the case of (V).

Also, when a relative humidity was 80% and a temperature of the specimen was −10° C., it took about 16 minutes to entirely freeze the aluminum surface in the case of (I) to (III), it took about 22 minutes to entirely freeze the aluminum surface in the case of (IV), and it took about 30 minutes to entirely freeze the aluminum surface in the case of (V).

As described above, it can be confirmed that the aluminum surface (V) prepared by the method of preparing a surface structure for delaying a freezing phenomenon according to the present invention exhibited the highest freezing-delaying rate at a relative humidity of 80% and a specimen temperature of both −5° C. and −10° C., indicating that it is possible to maintain functionality of the surface in a harsh environment of low temperature/high humidity.

In addition, since the period of a removing process of a freezing layer formed on the surface is prolonged by delaying a freezing phenomenon on the surface, the damage to the surface caused by the removing process of a freezing layer is reduced, and thus it is possible to maintain superhydrophobicity for a longer period of time.

Figure 6:
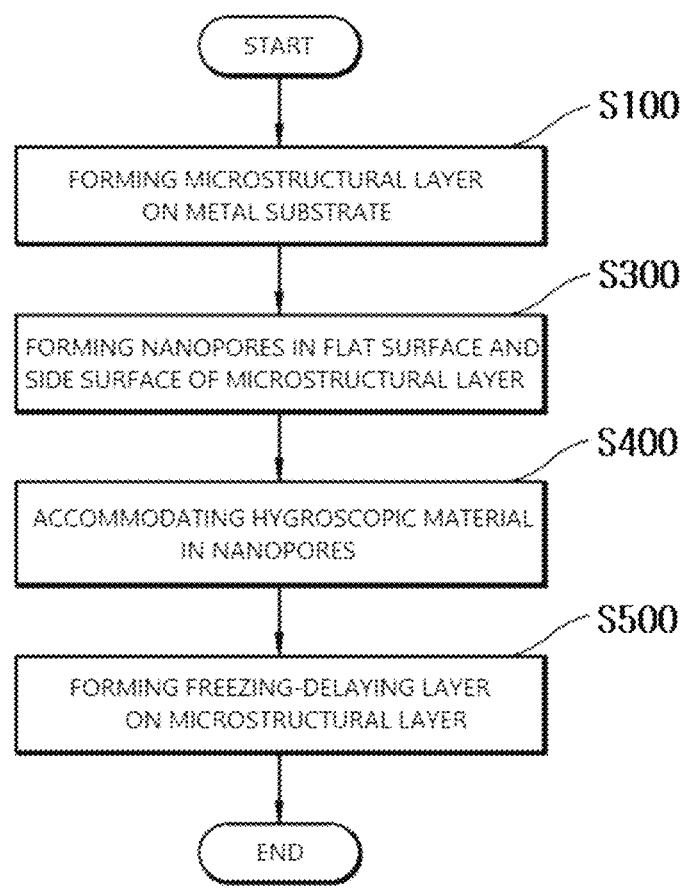
FIG. 6 is a flowchart of a method of preparing a surface structure according to a second embodiment of the present invention, including a schematic description of a separating process of a freezing layer.
Figure 7:
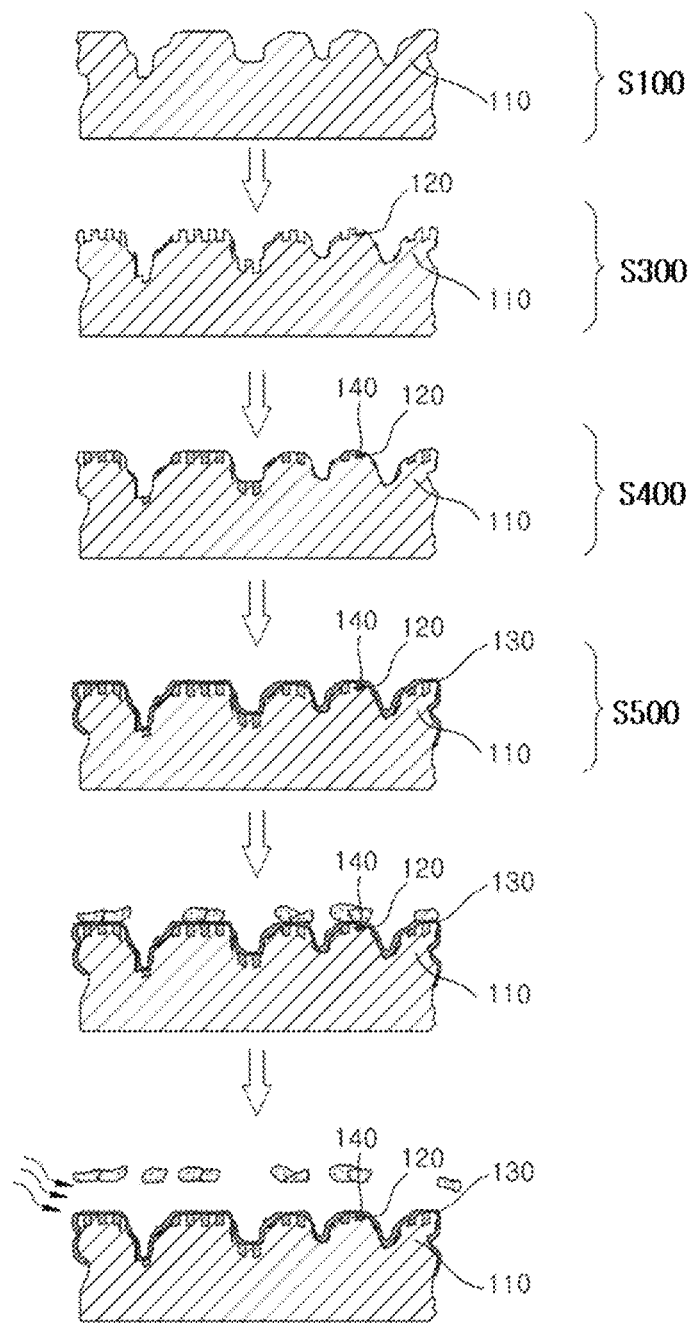
FIG. 7 is a schematic cross-sectional view of the structure of a metal substrate surface for each step of the preparation method according to the second embodiment shown in FIG. 6.

Hereinafter, a method of preparing a surface structure according to a second embodiment of the present invention will be described. A flowchart of the method of preparing a surface structure according to the second embodiment and a schematic diagram of a surface structure in the preparation process are illustrated in FIG. 6 and FIG. 7, respectively.

The method of preparing a surface structure according to the second embodiment of the present invention may include forming a microstructural layer (S100), drying a metal substrate, forming nanopores (S300), accommodating a hygroscopic material (S400), and forming a freezing-delaying layer (S500). A surface structure prepared according to the second embodiment further includes the hygroscopic material 140 accommodated in the nanopores 120 compared with the surface structure prepared according to the first embodiment. Therefore, only the steps from the accommodation of a hygroscopic material (S400) will be described below.

In the accommodation of a hygroscopic material (S400), the metal substrate 100 is immersed in the hygroscopic material 140 so as to accommodate the hygroscopic material 140 in the nanopores 120. In this case, the hygroscopic material 140 includes polyurethane or polyacrylic acid.

In the formation of a freezing-delaying layer (S500), the freezing-delaying layer 130 having a thickness of 1 nm to 20 nm is formed on the surface of the microstructural layer 110, and the freezing-delaying layer 130 may include fluorine (F) and may also include polydimethylsiloxane (PDMS).

When the freezing-delaying layer 130 includes fluorine, the metal substrate 100 may be immersed in a liquid chemical including fluorine to form the freezing-delaying layer 130 in the formation of a freezing-delaying layer (S500).

Alternatively, when the freezing-delaying layer 130 includes polydimethylsiloxane, the freezing-delaying layer 130 may be formed on the surface of the microstructural layer 110 by introducing the metal substrate 100 and a cured fragment of polydimethylsiloxane into an oven and heating at 200° C. to 300° C. for 1 minute to 3 hours to vaporize the fragment of polydimethylsiloxane, and then depositing the vaporized polydimethylsiloxane on the metal substrate 100 by physical vapor deposition in the formation of a freezing-delaying layer (S500).

For example, when the freezing-delaying layer 130 includes polydimethylsiloxane, and the formation of a freezing-delaying layer (S500) is continued at 230° C. for 5 minutes, a freezing-delaying layer 130 having a thickness of 13.9 nm is formed, and when the formation of a freezing-delaying layer (S500) is continued at 230° C. for 10 minutes, a freezing-delaying layer 130 having a thickness of 27.6 nm is formed.

However, the material and preparation method of the freezing-delaying layer 130 are not limited thereto, and any freezing-delaying layer may be used as long as it may have a thickness of 1 nm to 20 nm, may be applicable to a three-dimensional structure and a large-sized structure, and may be formed so as not to block the nanopores 120.

The hygroscopic material 140 of the surface structure formed through the above-described process is expanded due to moisture around the metal substrate 100 in a low temperature/high humidity environment and thus discharged from the nanopores 120. In this process, a hygroscopic material film is formed.

In this case, as shown in FIG. 6, when a low temperature/high humidity environment is maintained, ice/frost is formed on the surface of the metal substrate 100, wherein the ice/frost is substantially formed on the surface of the hygroscopic material film. Therefore, the hygroscopic material 140 reduces adhesion between the surface of the freezing-delaying layer 130 and the ice to allow the ice to be detached from the freezing-delaying layer 130.

That is, adhesion between the freezing-delaying layer 130 and the ice is reduced due to the hygroscopic material film formed of the hygroscopic material 140, which allows the ice to be easily detached from the metal substrate 100 by applying slight vibrations or slight wind to the metal substrate 100.

The present invention exhibits the following effects. First, a surface structure includes a hygroscopic material accommodated in nanopores of a micro/nano composite structure and a freezing-delaying layer formed on the micro/nano composite structure, and thus can allow a freezing phenomenon on a surface of a metal substrate to be delayed, and when a surface of the freezing-delaying layer is frozen, adhesion between the surface and ice can be minimized by the hygroscopic material accommodated in the nanopores so that ice formed on the surface is easily detached. Second, adhesion between the surface and ice is minimized, and thus the problem of pollution of a surrounding environment caused by a chemical material for removing ice can be resolved, and a freezing layer formed in a heat exchanger can be easily detached to prevent degradation of heat transfer efficiency of a heat exchanger. Third, a micro/nano composite structure is formed on the surface of a metal substrate through a chemical process and an immersing process, a hygroscopic material is accommodated therein, and a freezing-delaying layer is formed thereon, and thus these can also be applied to a three-dimensional large-sized structure.

While the example embodiments of the present invention and their advantages have been described in detail, it should be understood that various changes, substitutions and alterations may be made herein without departing from the scope of the invention.

What is claimed is:

1. A method of preparing a surface structure, comprising:
    forming a microstructural layer in a surface of a metal substrate in the form of microscale irregularities by etching the metal substrate with an acid solution;
    forming a plurality of nanopores in the microstructural layer by anodizing the metal substrate;
    forming a freezing-delaying layer on a surface of the microstructural layer; and
    accommodating a hygroscopic material in the nanopores between the formation of nanopores and the formation of a freezing-delaying layer.

2. The method of claim 1, wherein the freezing-delaying layer is formed with a thickness of 1 nm to 20 nm by physical vapor deposition.

3. The method of claim 1, wherein the metal substrate includes aluminum (Al).

4. The method of claim 1, wherein, in the formation of a freezing-delaying layer, the freezing-delaying layer is formed by vaporizing a cured fragment of polydimethylsiloxane through heating at 200° C. to 300° C. for 1 minute to 3 hours and depositing the vaporized polydimethylsiloxane on the metal substrate through physical vapor deposition.

5. The method of claim 1, further comprising drying the metal substrate between the formation of a microstructural layer and the formation of nanopores.

6. The method of claim 1, wherein the hygroscopic material is discharged from the nanopores to form a hygroscopic material film when a surface of the freezing-delaying layer starts to freeze, and thus adhesion between the surface of the freezing-delaying layer and ice is reduced to allow the ice to be detached from the freezing-delaying layer.

7. The method of claim 1, wherein the freeze-delaying layer is formed of a material including polydimethylsiloxane.

8. The method of claim 1, wherein the hygroscopic material is accommodated in the nanopores by immersing the metal substrate in the hygroscopic material.

* * * * *